(12) United States Patent
Esteghlal

(10) Patent No.: US 10,215,777 B2
(45) Date of Patent: Feb. 26, 2019

(54) METHOD FOR OPERATING AN ELECTRIC MACHINE, ELECTRIC MACHINE

(71) Applicant: Robert Bosch GmbH, Stuttgart (DE)

(72) Inventor: Gholamabas Esteghlal, Stuttgart-Weilimdorf (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/322,208

(22) PCT Filed: Apr. 23, 2015

(86) PCT No.: PCT/EP2015/058759
§ 371 (c)(1),
(2) Date: Dec. 27, 2016

(87) PCT Pub. No.: WO2015/197224
PCT Pub. Date: Dec. 30, 2015

(65) Prior Publication Data
US 2018/0210010 A1    Jul. 26, 2018

(30) Foreign Application Priority Data
Jun. 27, 2014  (DE) .......................... 10 2014 212 383

(51) Int. Cl.
*G01R 1/20* (2006.01)
*H02P 6/16* (2016.01)
(Continued)

(52) U.S. Cl.
CPC ................ *G01R 1/20* (2013.01); *H02P 1/163* (2013.01); *H02P 6/08* (2013.01); *H02P 6/16* (2013.01);
(Continued)

(58) Field of Classification Search
CPC ........................................................ H02P 21/18
See application file for complete search history.

(56) References Cited

U.S. PATENT DOCUMENTS

2005/0174104 A1 * 8/2005 Kranitzky .............. H02P 6/16
                                                    324/144
2013/0134967 A1 * 5/2013 Kaufmann ............ H02P 6/185
                                                    324/207.25

FOREIGN PATENT DOCUMENTS

| CN | 1518205 A   | 8/2004 |
| CN | 101714844 A | 5/2010 |

(Continued)

OTHER PUBLICATIONS

International Search Report for Application No. PCT/EP2015/058759 dated Jul. 3, 2015 (English Translation, 3 pages).
(Continued)

*Primary Examiner* — Clayton E Laballe
*Assistant Examiner* — Jas Sanghera
(74) *Attorney, Agent, or Firm* — Michael Best & Friedrich LLP

(57) ABSTRACT

The invention relates to a method for operating an electric machine (2). The electric machine (2) is driven using field-oriented regulation, and a current relative position ($\theta i$) of a rotating field is detected by means of at least one sensor (5). At least one electric voltage ($U\alpha s$, $U\beta s$) is generated which causes an electric rotor flux corresponding to the position ($\theta i$) detected by the sensor, the electric machine (2) is monitored for a torque generated by the voltage ($U\alpha s$, $U\beta s$) and an absolute position of the rotating field is determined depending on the generated torque.

9 Claims, 1 Drawing Sheet

(51) Int. Cl.
*H02P 21/10* (2016.01)
*H02P 1/16* (2006.01)
*H02P 6/08* (2016.01)
*H02P 6/185* (2016.01)
*H02P 6/22* (2006.01)

(52) U.S. Cl.
CPC ................ *H02P 6/185* (2013.01); *H02P 6/22* (2013.01); *H02P 21/10* (2013.01)

(56) References Cited

FOREIGN PATENT DOCUMENTS

| CN | 101933222 A | 12/2010 |
|---|---|---|
| DE | 10215428 | 10/2003 |
| DE | 102005059477 | 6/2007 |
| DE | 102009001955 | 10/2010 |
| DE | 102010063692 | 2/2012 |
| WO | 9720382 | 6/1997 |

OTHER PUBLICATIONS

Backhaus et al., "A Procedure to Estimate the Absolute Position of the Rotor Flux of a Permanent Magnet Synchronous Machine," European Conference on Power Electronics & Applications, vol. 3, Jan. 1, 1991, pp. 559-663.

\* cited by examiner

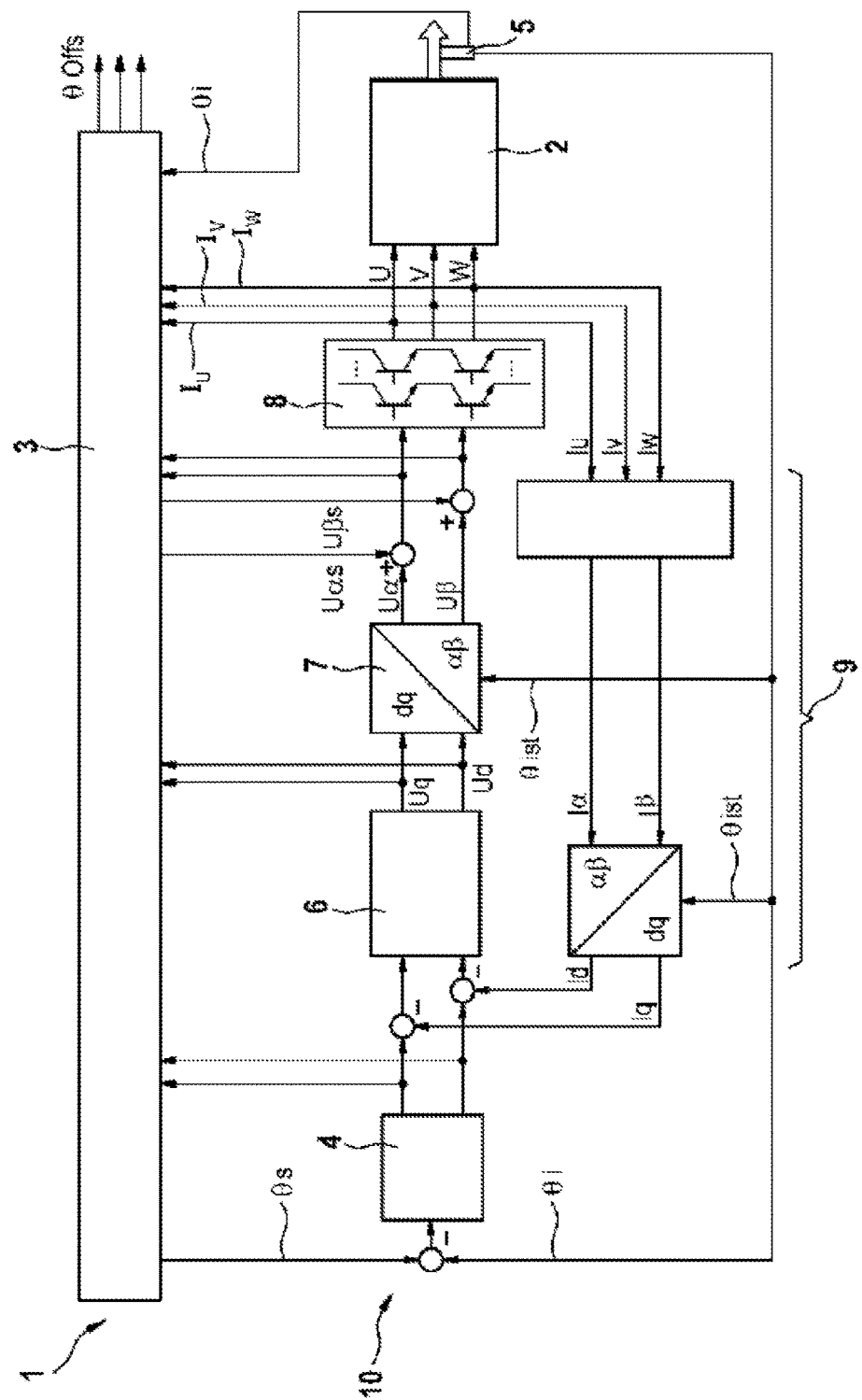

METHOD FOR OPERATING AN ELECTRIC MACHINE, ELECTRIC MACHINE

BACKGROUND OF THE INVENTION

The present invention relates to a method for operating an electric machine, wherein the electric machine is operated via field-oriented control, and wherein an instantaneous relative position of a rotating field is detected by means of at least one sensor.

Furthermore, the present invention relates to an electric machine, including a device for field-oriented control, and including at least one sensor for detecting an instantaneous relative position of a rotating field.

In field-oriented control of electric machines, the actual position of the rotating field is of great importance for optimal operation. In this context, it is known to detect the relative position of the rotating field by means of at least one sensor. Various sensors are already known for this. In order to be able to determine the position of the rotating field, the installation position of the sensor with respect to the rotating field must be known. Various methods have already been developed for this as well. Thus, for example, the so-called test pulse method is known, in which an anisotropy of the electric machine is used for determining the position of the so-called d-axis. Another known method determines the zero crossing of the phase currents in a rotating electric machine.

SUMMARY OF THE INVENTION

The method according to the present invention has the advantage that the installation position of the sensor with respect to the rotating field, or the absolute position of the rotating field, may be determined in a simple and economical manner, in particular without requiring rotation or operation of the electric machine. To this end, the method according to the present invention provides that a voltage is initially generated which generates an electric rotor flux corresponding to the position detected by the sensor. The electric machine is monitored to ascertain whether a torque is generated. If the sensor is placed in such a way that the instantaneously measured rotor flux position corresponds to the absolute value of the angle of the rotating field if, for example, the sensor provides an electrical angle value of 30°, and the rotor flux direction is also at 30°, and if a voltage is generated which causes a rotor flux precisely in the position detected by the sensor, i.e., in the present example, electrically at 30°, then the rotor of the electric machine would not rotate. Therefore, the absolute position of the rotating field is presently detected as a function of the generated torque. In fact, if a torque or a sufficiently high torque is generated which could result in a rotation of the rotor of the electric machine, the instantaneous rotating field position deviates from the absolute position. Thus, a deviation of the absolute position from the relative position may thereby be detected, so the absolute position of the rotating field may be deduced in this way.

Preferably, it is provided that at least one generated phase current of the electric machine is monitored and compared to a limit value, wherein a friction torque of the electric machine is surmounted if the phase current exceeds the limit value. The limit value is thus selected in such a way that if it is exceeded, a friction torque of the electric machine is surmounted, so that if the detected phase current is below the limit value, it is not possible to initiate a rotation of the rotor of the electric machine, since the friction torque is not surmounted. By taking into account this limit value, it may be ensured that the absence of a rotation of the rotor is not caused by the friction torque.

Preferably, the voltage is adjusted in such a way that the at least one generated phase current exceeds the limit value. As a result, it is ensured that sufficient power is always generated in order to surmount the friction torque of the electric machine. It is thus ensured that a rotor which is at a standstill due to the friction torque which has not been surmounted is not mistaken for a rotor which is at a standstill due to the absence of a deviation of the relative position from the absolute position of the rotating field.

Furthermore, it is preferably provided that the electric machine is operated by means of a rotating field controller, wherein a control difference which is set by the controller is monitored, and the absolute position of the rotating field is determined as a function of the control difference. In the method described above, the generally provided rotating field controller counteracts the torque generated by the impressed (test) voltage or the movement of the rotor in that it eliminates the influence of the applied voltage by altering the rotating field. The controller thus alters the generated flux direction by adjusting of the operating voltage or operating voltages, until no more torque is generated, or the rotor no longer rotates or tries to rotate. The control difference which is required for this, which thus results from the torque, is used as a measure of the aforementioned deviation, in order to determine the absolute position of the rotating field from it.

Furthermore, it is preferably provided that the absolute position of the rotating field is determined only if the control difference is below a predefinable threshold value, and if, as already mentioned above, the phase current is greater than the predefined limit value.

Furthermore, it is preferably provided that for determining the absolute position, the rotor angle is determined as a function of the output values of the current controller, the phase voltages, and/or the phase currents.

The electric machine according to the invention is characterized by a test apparatus, in particular a control unit which, for determining an absolute position of the rotating field, generates a voltage which induces a rotor flux in the position detected by the sensor, and which monitors the electric machine to ascertain whether a torque is generated by the induced voltage, in order to determine the absolute position of the rotating field as a function of the generated torque.

BRIEF DESCRIPTION OF THE DRAWING

The present invention shall be described in greater detail based on one exemplary embodiment. For this purpose, the single FIGURE shows an apparatus for operating an electric machine in the form of a simplified circuit arrangement.

DETAILED DESCRIPTION

The single FIGURE shows an apparatus 1 for operating an electric machine 2 in the form of a simplified circuit arrangement. The electric machine 2 has three phases U, V, and W, and is operated via a device 10 of the apparatus 1 by means of field-oriented control. In this case, a control unit 3 is provided, which controls and monitors the operation of the electric machine 2. The apparatus 1 has a rotating field controller 4 which sets a rotating field angle for the electric machine 2 as a function of a setpoint specification θs. A sensor 5 is associated with the electric machine 2 for detecting the instantaneous position of the rotating field. The actual value of the position θi is also conveyed to the field controller 4, which correspondingly determines a control difference for adjusting the rotating field as a function of the setpoint specification (θs).

Furthermore, the apparatus 1 includes a current controller 6, as well as a unit 7 for carrying out an inverse Clarke transformation, a bridge circuit 8, and a device 9 for carrying out a Clarke-Parks transformation.

The following thought it taken as a basis for the apparatus 1: If the sensor 5 is placed in such a way that the instantaneously measured rotor flux position corresponds to the absolute value of the angle of the rotating field, and if a voltage Uαs, Uβs is impressed which induces a rotor flux precisely at the value provided by the sensor 5, then the rotor would not rotate or no torque would be generated if the value detected by the sensor were to be correct. For example, if the sensor 5 provides a sensor value of θi=30°, then the rotor flux direction would also have to correspond to 30°.

The phase currents Iu, Iv, and Iw are presently detected and compared to a predefinable limit value by the control unit 3. The limit value is selected in such a way that if the set phase currents exceed the limit value, a friction torque of the electric machine 2 would be surmounted, as of which a rotor of the electric machine 2 begins to rotate. Each applied voltage Uαs, Uβs is therefore varied in such a way until each generated phase current becomes greater than the aforementioned limit value, thereby ensuring that the friction torque of the electric machine 2 is surmounted.

If the sensor value θi is not correct and, for example, deviates by 70° from the setpoint angle θs, then the rotor of the electric machine 2 will move in the direction of the rotating field. At the beginning of the method, the sensor value is stored and predefined as a setpoint value for an angle control of the rotating field controller 4. The rotating field controller 4 attempts to counteract the movement of the rotor and thus to eliminate the influence of the applied voltage Uαs, Uβs by altering the field. Thus, the rotating field controller 4 alters the generated flux direction by adjusting the applied voltages Uαs, Uβs until the rotor no longer tries to rotate.

If the control difference of the rotating field controller 4 is smaller than a predefinable threshold value, and the detected phase current is greater than the predefined limit value, then the rotor angle is determined either from α, β or d, q currents, or α, β or U, V, W voltages, or from the controller output of the rotating field controller 4. Here is an example:

$$\theta_{stimm} = a\tan 2(I_\alpha/I_{norm}, I_\beta I_{norm}) \text{ where}$$
$$I_{norm} = \text{normalized current; and}$$

$$\theta_{Offset} = I\theta_{stimm} - \theta_{Sensor}I; \text{ or}$$

$$\theta_{Offset} = I\text{Arg}(U_{\alpha\beta}) - \text{Arg}(U_{\alpha\beta s})I; \text{ where } U_{\alpha\beta s} = \text{applied voltage}$$

The described method is preferably carried out once according to the apparatus 1 directly after the production of the electric machine or during each commissioning of the electric machine 2. Using the advantageous method of the apparatus 1, in the case of a stationary electric machine 2, it is possible to determine the absolute position of the rotating field with sufficient precision.

The invention claimed is:

1. A method for operating an electric machine (2) that is operated via field-oriented control, the method comprising:
   detecting an instantaneous relative position (θi) of a rotating field by means of at least one sensor (5),
   generating at least one voltage (Uαs, Uβs) which induces an electric rotor flux corresponding to the position (θi) detected by the sensor, wherein the induced electric rotor flux does not move a rotor of the electric machine,
   monitoring the electric machine for a torque generated by the voltage (Uαs, Uβs), and
   determining an absolute position of the rotating field as a function of the generated torque.

2. The method as claimed in claim 1, wherein at least one phase current (Iu, Iv, Iw) generated by the voltage (Uαs, Uβs) is monitored and compared to a limit value, wherein a friction torque of the electric machine (2) is surmounted if the phase current (Iu, Iv, Iw) exceeds the limit value.

3. The method as claimed in claim 2, wherein the voltage (Uαs, Uβs) is adjusted in such a way that the at least one phase current (Iu, Iv, Iw) exceeds the limit value.

4. The method as claimed in claim 1, wherein the electric machine (2) is operated by means of a rotating field controller (4), wherein a control difference which is set by the rotating field controller (4) is monitored, and the absolute position is determined as a function of the control difference.

5. The method as claimed in claim 4, wherein the absolute position is determined only if the control difference is below a predefinable threshold value.

6. The method as claimed in claim 1, wherein a rotor angle of the electric machine (2) is determined for determining the absolute position.

7. The method as claimed in claim 1, wherein the induced electric flux does not move the rotor of the electric machine because the instantaneous relative position measured by the sensor is equal to an absolute value of an angle of the rotating field.

8. The method as claimed in claim 1, wherein the induced electric flux does not move the rotor of the electric machine because a rotating field controller adjusts the at least one generated voltage to counteract movement of the rotor.

9. An apparatus (1) for operating an electric machine (2), the apparatus comprising:
   a device (10) for field-oriented control of the electric machine (2),
   at least one sensor (5) for detecting an instantaneous position (θi) of a rotating field of the electric machine, and
   a test apparatus (3) which, for determining an absolute position of the rotating field,
   generates at least one voltage (Uαs, Uβs) which induces a rotor flux corresponding to the position detected by the sensor (5), wherein the induced rotor flux does not move a rotor of the electric machine, and
   which monitors the electric machine (2) to ascertain whether a torque was generated by the voltage (Uαs, Uβs), in order to determine the absolute position of the rotating field as a function of the generated torque.

\* \* \* \* \*